United States Patent
Lindberg et al.

(10) Patent No.: US 6,888,061 B2
(45) Date of Patent: May 3, 2005

(54) FEEDTHROUGH INTERCONNECTION ASSEMBLY

(75) Inventors: Lars Lindberg, Stockholm (SE); Lars-Gote Svenson, Sollentuna (SE); Edgard Goodbar, Stockholm (SE)

(73) Assignee: Optillion AB (SE)

( * ) Notice: Subject to any disclaimer, the term of this patent is extended or adjusted under 35 U.S.C. 154(b) by 139 days.

(21) Appl. No.: 10/317,868

(22) Filed: Dec. 12, 2002

(65) Prior Publication Data

US 2003/0111243 A1 Jun. 19, 2003

(51) Int. Cl.7 .................................................. H05K 9/00
(52) U.S. Cl. .......................... 174/32; 333/246; 333/260
(58) Field of Search ............................... 174/32, 35 R, 174/35 C, 35 MS; 333/246, 247, 238, 260, 254, 202, 204

(56) References Cited

U.S. PATENT DOCUMENTS

| | | | | |
|---|---|---|---|---|
| 4,873,566 A | * | 10/1989 | Hokanson et al. | 257/98 |
| 4,922,325 A | * | 5/1990 | Smeltz, Jr. | 257/686 |
| 5,406,235 A | * | 4/1995 | Hayashi | 333/204 |
| 5,428,327 A | * | 6/1995 | Bahl | 333/246 |
| 5,923,234 A | * | 7/1999 | Holzman et al. | 333/238 |

FOREIGN PATENT DOCUMENTS

CA    2305954 A1 * 10/2000 ............ H01L/23/02

* cited by examiner

Primary Examiner—Dean A. Reichard
Assistant Examiner—Carmelo Oliva
(74) Attorney, Agent, or Firm—Coudert Brothers LLP

(57) ABSTRACT

The present invention relates to optimization of communication equipment with respect to size and undesired signal interference. To this aim a ceramic feedthrough interconnection assembly is proposed in order to transport an electrical information signal to and from a communication capsule. In addition to at least one signal lead (103a, 103b) for communicating an electrical information signal, the assembly contains at least one auxiliary lead and a shield (103c, 103d, 104, 104a, 104b, 104f) that electrically shields the at least one signal lead (103a, 103b) from the at least one auxiliary lead. The shield (103c, 103d, 104, 104a, 104b, 104f) has such dimensions ($d_1, d_2$) and is positioned at such distance ($d_3, d_4, d_{12}$) from the at least one signal lead (103a, 103b) that the electrical information signal experiences a well-defined and substantially constant impedance in the assembly. This in turn, minimizes the risk of undesired signal reflections. At the same time the assembly allows a high lead density, i.e. short distances between the leads.

20 Claims, 4 Drawing Sheets

FEEDTHROUGH INTERCONNECTION ASSEMBLY

THE BACKGROUND OF THE INVENTION AND PRIOR ART

The present invention relates generally to optimization of communication equipment with respect to size and undesired signal interference. More particularly the invention relates to a ceramic feedthrough interconnection assembly. The invention also relates to an optoelectrical capsule and an optoelectrical transceiver according to the preamble of claim 11.

Very simple electronic components and elements, such as resistors, capacitors and inductors, may be placed directly onto a circuit board. However, more complex units, such as integrated circuits and optoelectrical components, are most commonly encapsulated or by other means arranged within a protecting package before being attached to the circuit board. In the latter case, a feedthrough of one or more electrical conductors is necessary in order to accomplish an electrical contact between the unit inside the capsule and relevant circuitry outside the same.

When processing information signals of a comparatively high frequency or bitrate it is generally preferable to shield these signals to the utmost possible extent from any other signals in order to reduce the risk of unintended interference between the high-frequency information signals and the other signals (possibly also of high frequency). Therefore, a capsule containing a high-frequency communication unit is in most cases electrically shielded. Consequently, a lead feedthrough for this kind of capsule must also be electrically shielded. Moreover, in order to reduce the risk of signal reflections (in turn resulting in e.g. distortion), the feedthrough should have a characteristic impedance with respect to the electrical information signal, which matches the impedance that this signal experiences otherwise.

Canadian patent No. 2,305,954 discloses a package for a high-frequency device. A metallic casing here surrounds a photodetector. Metallic signal terminals pass through the casing via a glass insulator. Moreover, each terminal is flanked by a pair of conductive protruding portions that are formed on a sidewall of the casing. The protruding portions have a design, which is intended to match the characteristic impedance for the signal being transported via the terminal. However, since the same terminal is surrounded by first ambient air (on the outside of the casing), second glass (in the casing wall) and third again a gas, e.g. air (inside the casing), the impedance match cannot be altogether optimal. On the contrary, the different dielectric constants of the different surrounding materials will inevitably cause impedance mismatches with respect to the signal sent via the terminal and therefore cause signal reflections.

U.S. Pat. No. 4,873,566 describes a multilayer ceramic laser package to which an unshielded high bitrate input signal is fed on a differential signal format via a first face of the package. A set of auxiliary electrical conductors for communication of various types of relatively low-frequency signals are fed through a second face of the package. Finally, an optical output signal is transmitted over an optical fiber being attached to a third face of the package. The document also suggests that the dimensions of the metallized areas per se, which constitute the conductor surfaces, should be adapted such that the impedance of the high frequency input can be better matched to the optical device.

Methods for shielding a conductor, which is fed through a ceramic capsule wall are known per se, for example via U.S. Pat. No. 4,922,325. This document discloses a multi-layer ceramic package, which simulates the performance of a conventional coaxial connector with respect to a high-frequency information signal. Thus a high-quality transmission of this signal through the ceramic capsule wall is made possible.

Today, there is a strong market demand for communication units having as small size as possible. Therefore, it is interesting to concentrate the number of processed information bits per physical volume unit as much as possible and thus reduce the overall size of the equipment. For the same reason, capsules containing sub-units of a particular communication unit should also be placed as close as possible to each other.

One way to economize the circuit board area in a communication unit is to reduce each capsule's footprint on the circuit board. This can be accomplished by positioning the capsules such that each capsule has a projection on the circuit board which is smaller than the capsule's largest side. Unfortunately, this strategy is prone to cause other problems. Namely, positioning a capsule with a non-largest side towards the circuit board severely limits the width of the direct physical interface between the capsule and the circuit board. Hence, in order to maintain an acceptable lead density with respect to the risk of signal interference between neighboring electrical leads to the capsule, the leads would need to be distributed also over an area of the capsule which is not immediately proximate to the circuit board. However, this would in turn again increase the risk of signal interference due a general prolongation of the leads between the capsule and the circuit board. Furthermore, the assemblage of such a capsule would become relatively complicated. For example, the package design proposed in U.S. Pat. No. A, 4,873,566 would either require relatively long leads for transporting the high-frequency signal between the circuit board and the first face of the package or require a corresponding set of relatively long leads for transporting the low-frequency signals between the second face of the capsule and the circuit board.

SUMMARY OF THE INVENTION

The object of the present invention is therefore to provide a feedthrough design, which alleviates these problems and thus offers a solution that allows a very high processing capacity per physical volume unit without compromising the requirement to suppress and avoid distortion of the electrical information signals.

According to one aspect of the invention, the object is achieved by a ceramic feedthrough interconnection assembly containing: at least one signal lead for communicating an electrical information signal, at least one auxiliary lead in addition to the at least one signal lead and a shield which electrically shields the at least one signal lead from the at least one auxiliary lead. The shield has such dimensions and is positioned at such distance from the at least one signal lead, and the distance between the at least one signal lead and the shield is adapted with respect to the dielectric constant of at least one electrically insulating material, which adjoins the at least one signal lead, that the electrical information signal experiences a well-defined and substantially constant impedance in the feedthrough.

An advantageous effect of this design is that the reflection of the electrical information signal thereby can be minimized. Thus, a high efficiency may be accomplished in the transport of the information signal. For example, if the feedthrough is used to convey an electrical information signal to and/or from a capsule containing an optoelectrical element (such as a semiconductor laser or a photodiode), the effectiveness of the conversion process between the electrical and the optical signal format may also be increased.

Typically, the material adjoining the leads includes the ceramic. However, it may also include at least one additional material, such as the ambient air or a capsule filling. By adapting the distance between the leads and the shield to the dielectric constant of the additional material, an improved impedance match is accomplished for the electrical information signal. This, in turn, further reduces the risk of undesired signal reflections and degrading of the quality of the electrical information signal.

According to a preferred embodiment of this aspect of the invention, the feedthrough comprises two signal leads for communicating the electrical information signal on a differential signal format. The distance between the two signal leads is here adapted with respect to the dielectric constant of an electrically insulating material, e.g. ceramic, between the signal leads. A differential signal format is generally advantageous because it is relatively insensitive to signal interference and other disturbances. At the same time it provides a relatively power efficient transport of the information signal.

According to a preferred embodiment of this aspect of the invention, the assembly is adapted to extend exclusively over one face of a component capsule. Thus a placement of the capsule in an area-efficient manner is made possible.

According to yet another preferred embodiment of this aspect of the invention, the feedthrough comprises at least one section in which the at least one signal lead is exposed to a non-ceramic insulating material. Preferably, the distance between the at least one signal lead and the shield is here also adapted with respect to the dielectric constant of the non-ceramic insulating material. Such adaptation is, of course, advantageous since it further assists in improving the impedance match for the electrical information signal.

According to still another preferred embodiment of this aspect of the invention, the at least one signal lead represents a microstrip structure in the above-mentioned section. I.e. there is a ground plane exclusively on one side of the at least one signal lead. Typically, sections of this kind are present in an outermost and/or innermost part of the proposed feedthrough. The microstrip structure provides an appropriate transition to units being located on the inside respective the outside of a capsule in which the feedthrough is included.

According to an additional preferred embodiment of this aspect of the invention, the feedthrough comprises at least one section in which the least one signal lead instead represents a stripline structure. In case the feedthrough includes one or more of the microstrip-structure sections referred to above, the stripline-structure section is preferably located in between the former, i.e. typically in a section adjoining the capsule wall. This section does normally not include any non-ceramic material between the at least one signal lead and the screen. Nor does such material adjoin the at least one signal lead. Therefore, a ceramic stripline structure may accomplish an adequate impedance match for the electrical information signal.

According to another preferred embodiment of this aspect of the invention, the shield is connectable to an external ground potential via at least one lead dedicated therefor. This is advantageous, since a grounding of the shield vouches for an adequate shielding in most applications.

According to still another preferred embodiment of this aspect of the invention, the shield exclusively surrounds the at least one signal lead, i.e. no other leads are present behind the shield. Naturally, this minimizes the risk of undesired signal interference and is therefore advantageous.

According to another aspect of the invention the object is achieved by an optoelectrical capsule as described initially, which is characterized in that it comprises at least one proposed feedthrough interconnection assembly.

According to a preferred embodiment of this aspect of the invention, the capsule is adapted to be positioned on a circuit board, such that its footprint towards the circuit board has a smaller area than the area of a largest side of the capsule. An important advantage accomplished by placing the capsule in this manner is that the capsule occupies a comparatively small area on the circuit board. Furthermore, the ceramic feedthrough permits a high lead density without deteriorating the electrical information signal by means of interference. The leads may therefore be fed out via a comparatively small interface area towards the circuit board.

According to yet another aspect of the invention, the object is achieved by an optoelectrical transceiver unit as described initially, which is characterized in that it contains at least one of the above-proposed optoelectrical capsules.

To sum up, the invention offers a capsule feedthrough solution with a relatively low risk of signal interference for any electrical information signals being communicated with units outside the capsule. At the same time, the available circuit board area may be utilized very efficiently. The invention thus provides a competitive edge to all communication systems where optical transmitters are utilized for the transmission of information.

BRIEF DESCRIPTION OF THE DRAWINGS

The present invention is now to be explained more closely by means of preferred embodiments, which are disclosed as examples, and with reference to the attached drawings.

FIG. 4b shows a top-view corresponding to the image shown in FIG. 4a.

DESCRIPTION OF PREFERRED
EMBODIMENTS OF THE INVENTION

Figure 1:
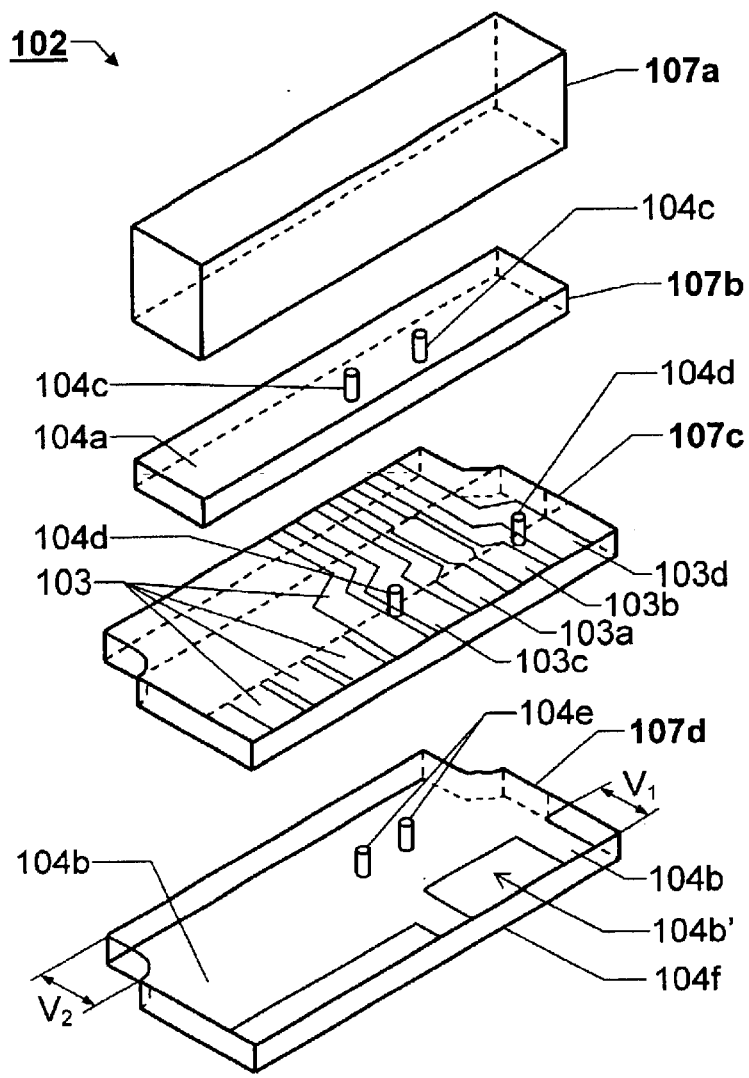
FIG. 1 shows an exploded diagram over a ceramic feedthrough interconnection assembly according to an embodiment of the invention.

FIG. 1 shows an exploded diagram over a ceramic feedthrough interconnection assembly 102 according to an embodiment of the invention. The assembly 102 includes one block 107a which may be made of either a ceramic or a conducting material, such as a metal, and three ceramic blocks 107b, 107c and 107d, whose lateral surfaces contain metallized areas 103, 103a, 103b, 103c, 103d, 104a, 104b and 104f that either represent electrical signal leads or accomplish electric shielding functions. Vertical conducting vias 104c, 104d and 104e through the ceramic blocks 107b, 107c and 107d connect the metallized areas 103, 103a, 103b, 103c, 103d, 104a, 104b and 104f located on opposite sides of the ceramic blocks 107b, 107c and 107d, such that a desired configuration is attained.

The depth of the blocks 107a and 107b in relation to the depth of the blocks 107c and 107d is such that the lateral surfaces of the blocks 107c and 107d protrudes a first distance $V_1$ on the outside of the assembly 102 (i.e. the side of the assembly that faces out from the capsule into which it is integrated) from the vertical side of the blocks 107a and 107b, and correspondingly protrudes a second distance $V_2$ on the inside of the assembly 102 (i.e. the side of the assembly that faces inwards the capsule into which it is integrated).

Signal leads 103a and 103b for transporting an electrical information signal on a differential format are formed on an upper surface of a first ceramic block 107c. These signal leads 103a; 103b are accompanied by a pair of leads 103c and 103d respectively, which form part of an electrical shield around the signal leads 103a; 103b. Additionally, the upper surface of the block 107c outside the leads 103c; 103d contains a set of auxiliary leads 103 for conveying relatively low-frequency signals, such as control commands or measurement data. Only one of the auxiliary leads 103 is, however, explicitly outlined in the figure. At least two conducting vias 104d (or equivalent connectors) connect the leads 103c and 103d electrically to a metallized area 104b on a second ceramic block 107d below the first block 107c.

The metallized area 104b covers a relatively large portion of an upper surface of the second block 107d. The area 104b is further adapted to be electrically connected to the ground potential. The area 104b thus constitutes a ground plane with respect to the leads 103, 103a and 103b in the first block 107c. One or more conducting vias 104e (or equivalent connectors) connect the metallized area 104b electrically to another metallized area 104f, which preferably covers the entire lower surface of the second block 107d. Hence, the area 104f likewise constitutes a ground plane. An indentation 104b' in the area 104b forms an opening in the upper ground plane in the second block 107d. The indentation 104b' is positioned below the signal leads 103a and 103b such that the area 104f instead represents a closest ground plane to these leads 103a; 103b, i.e. at a larger distance than the distance between the leads 103a; 103b and the area 104b inside the indentation 104b'. The indentation 104b' thereby assists in accomplishing an adaptation for the difference in dielectric constant between the ceramic in the assembly and the ambient air, which adjoins the outermost part of the assembly, such that the electrical information signal experiences a well-defined and substantially constant impedance.

Nevertheless, below the shield leads 103c and 103d the metallized area 104b preferably extends to the edge of the second block 107d. This namely enhances the shielding effect.

A third ceramic block 107b above the first block 107c is slightly narrower than the first and second blocks 107c and 107d respectively. Thereby, the upper face of the outermost portion of the first block 107c is exposed to the assembly 102 exterior (i.e. typically the ambient air). An upper surface of the third block 107b contains a metallized area 104a, preferably covering the entire surface. At least two conducting vias 104c (or equivalent connectors) connect the metallized area 104a electrically to the shield leads 103c and 103d, such that the area 104a becomes yet a part of the shield for the signal leads 103a and 103b.

Finally, a fourth block 107a is positioned above the third ceramic block 107b. According to a preferred embodiment of the invention, the fourth block 107a connects the metallized area 104a on the third block 107b electrically to a capsule wall 110 in which the assembly 102 is incorporated. The fourth block 107a may thus be made of metal. However, the fourth block 107a may equally well be filled with a ceramic, include a conducting surface against the capsule wall 110 and contain at least one conducting via, which connects the metallized area 104a electrically to the conducting surface. Alternatively, the fourth block 107a may instead provide an electrical insulation between the metallized area 104a and the capsule wall 110. In this case, the block 107a is preferably composed of a non-conducting material, such as a ceramic.

As outlined in FIG. 1, the width of the signal leads 103a and 103b varies over the upper surface of the first ceramic block 107c. This adapts the electrical characteristics of the transmission path for the electrical information signal, such that this signal experiences a well-defined and substantially constant impedance although, for instance, the dielectric constant of the insulating material adjoining the leads 103a; 103b varies through the assembly 102.

Regarding the relationship between the physical dimensions of the assembly, the dielectric constant and the characteristic impedance, the following rule of thumb applies. For a given insulating material (with a known dielectric constant) between the electrical signal leads as well as in the volume between the signal leads and a surrounding shield, a decreased distance between the signal leads requires an increased distance between the signal leads and the shield in order to maintain a certain characteristic impedance for a particular electrical information signal. Thus, by allowing the distance between the signal leads and the shield to increase, a higher lead density can be tolerated without compromising the characteristic impedance. Naturally, any variation of the insulating material (and the dielectric constant) between the leads and/or between the leads and the shield also requires an adequate compensation in order to accomplish a desired characteristic impedance.

Figure 2:
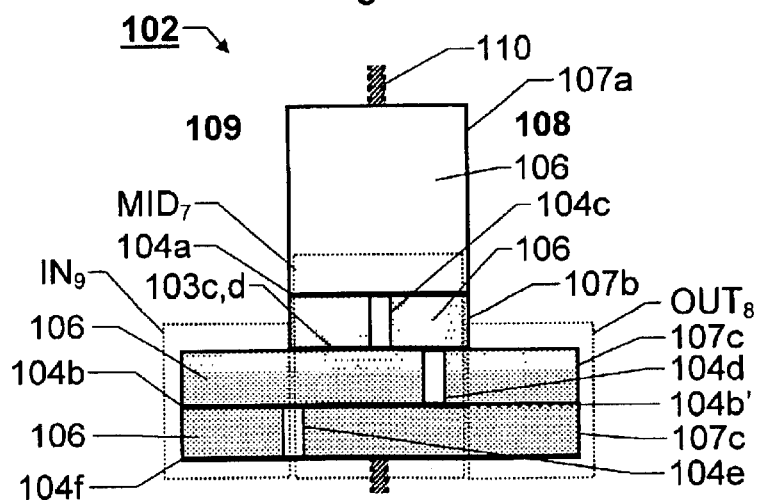
FIG. 2 depicts a first cross-section view of the assembly shown in FIG. 1.

FIG. 2 depicts a cross-section view (perpendicular to the electrical leads) of the feedthrough interconnection assembly 102 shown in FIG. 1. FIG. 2 primarily illustrates the shield 103c, 103d, 104, 104a, 104b, 104c, 104d discussed with reference to FIG. 1 above.

The assembly 102, which is here mounted in a capsule wall 110, includes three principal sections $OUT_8$, $MID_7$ and $IN_9$. A first section $OUT_8$ represents an outermost part of the assembly 102 where any leads fed through the assembly 102 are exposed to a non-ceramic insulating material 108, such as the ambient air. A second section $IN_9$ represents an innermost part of the assembly 102 where the leads fed through the assembly 102 likewise are exposed to a non-ceramic insulating material 109 (e.g. a gas) inside the capsule wall 110. A third and middle section $MID_7$ attaches the assembly 102 to the capsule wall 110. In this section the leads in the assembly 102 are exclusively exposed to a ceramic insulating material 106.

Figure 6:
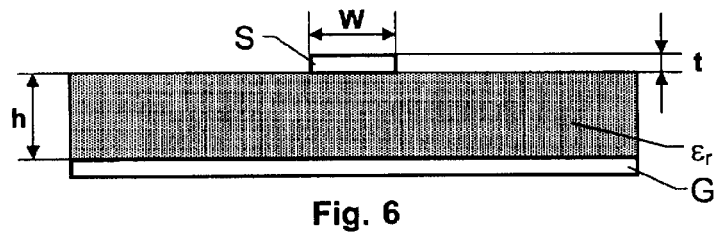
FIG. 6 schematically illustrates the structure of a microstrip conductor.

Signal leads (not shown in FIG. 2) on the upper surface of the second ceramic block 107d in the first section $OUT_8$ represent a microstrip structure, i.e. there is a ground plane on one side of the signal leads (see FIG. 6). Here, due to the indentation 104b' in the metallized area 104b, the metallized area 104f constitutes this ground plane.

Figure 5:
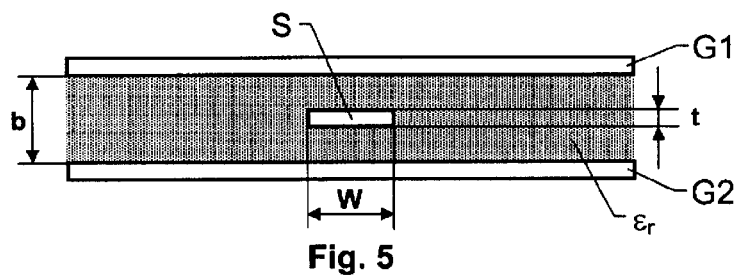
FIG. 5 schematically illustrates the structure of a stripline conductor.

In the third section MID$_7$, however, the signal leads represent a stripline structure, i.e. there are ground planes on both sides of the signal leads (see FIG. 5). The metallized area 104a here constitutes an upper ground plane whereas the metallized area 104 constitutes a lower ground plane.

In the second section IN$_9$, the signal leads represent a microstrip structure, where depending on the electromagnetic characteristics of the assembly 102 relative to the electromagnetic characteristics of the capsule interior, either the area 104b or the area 104f constitutes the ground plane. Nevertheless, FIG. 2 shows a design in which the area 104b is included in the microstrip structure (i.e. without an indentation in the area 104b).

Furthermore, in all three sections OUT$_8$, MID$_7$ and IN$_9$, the signal leads are accompanied by co-planar shield leads 103c and 103d, i.e. the shield leads 103c; 103d lie in level with the signal leads on the upper surface of the second ceramic block 107d. The ground plane 104a and the shield leads 103c; 103d are electrically connected to each other via at least two conducting vias 104c, the shield leads 103c; 103d are further electrically connected to the ground plane 104b via at least two conducting vias 104d and the ground plane 104b is connected to the ground plane 104f through at least one conducting via 104e. The volume between the ground planes 104a, 104b and 104f as well as the volume between the shield leads 103c; 103d and the signal leads are filled with a ceramic material 106 having a known and well-defined dielectric constant.

Figure 3:
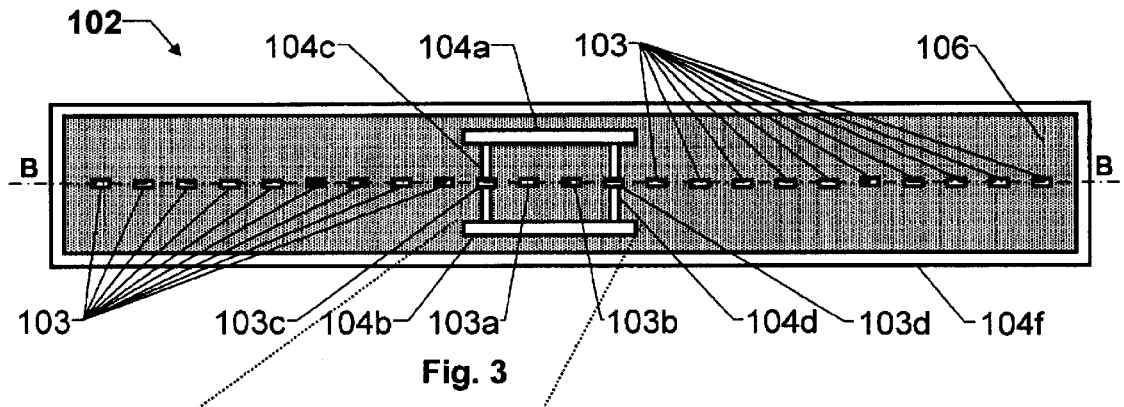
FIG. 3 shows a second cross-section view of a ceramic feedthrough interconnection assembly according to an embodiment of the invention.

FIG. 3 however, shows a cross-section view of the mid section MID$_7$ of the ceramic feedthrough interconnection assembly 102 shown in FIG. 2. FIG. 3 represents a view in parallel with the electrical leads 103a–d; 103 in the assembly 102. The assembly 102 contains two signal leads 103a and 103b for receiving or transmitting an electrical information signal on a differential format. The assembly 102 also includes a multitude of auxiliary leads 103, which may be used to transport other signals to and from the capsule 100, for example in the form of control commands or measurement data. Moreover, two leads 103c and 103d in the assembly 102 are adapted for attaching an external ground potential. These leads 103c; 103d are each further connected to conducting bars (or equivalent connectors) 104c; 104d. The conducting bars 104c; 104d, in turn, are electrically connected to a respective metal plane 104a above and 104b below the signal leads 103a; 103b. Hence, the metal planes 104a; 104b, the conducting bars 104c; 104d and the ground leads 103c; 103d together form a shield around the signal leads 103a; 103b. Provided that the ground leads 103c; 103d are attached to the ground potential, the shield also attains the ground potential.

Preferably, the shield 103c, 103d, 104a, 104b, 104c and 104d exclusively surrounds the signal leads 103a; 103b. In other words, no leads other than the signal leads 103a and 103b are present behind the shield. The shield 103c, 103d, 104, 104a, 104b thereby efficiently shields the signal leads 103a and 103b electrically from the auxiliary leads 103. A ceramic 106, which is electrically non-conductive and has a known and well-defined dielectric constant fills the entire space between the leads 103, 103a, 103b and the shield 103c, 103d, 104a, 104b, 104c and 104d in the mid section MID$_7$ of the assembly 102. However, in an outermost section (see OUT$_8$ in FIG. 2) one or more non-ceramic materials may adjoin the leads 103, 103a, 103b and/or the shield 103c, 103d, 104a, 104b, 104c. This will be further discussed below with reference to FIG. 4a.

Figure 4A:
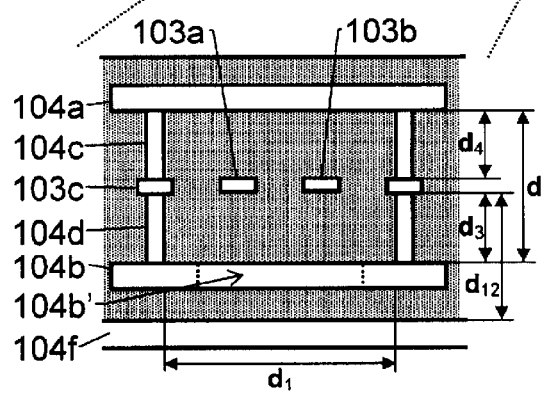
FIG. 4a shows a partial and enlarged image of the cross-section section represented in FIG. 3.

FIG. 4a shows a partial and enlarged image of the cross-section view of the mid section MID$_7$ of the ceramic feedthrough interconnection assembly 102 represented in FIG. 3. In order to accomplish a well-defined impedance, of e.g. 50 Ω, for the electrical information signal, which is as constant as possible through the assembly 102, the physical configuration of the shield 103c, 103d, 104a–c is adapted to the varying dielectric constant in the different sections IN$_9$, MID$_7$ and OUT$_8$ of the assembly 102.

Basically, the characteristic impedance $Z_0$ of a single transmission line is equal to:

$$Z_0 = \sqrt{\frac{L}{C}}$$

where L is the inductance per length unit and C is the capacitance per length unit. It is, however, relatively complicated to describe the characteristic impedance $Z_0$ of a differential transmission line in proximity to a ground potential in terms of a general expression. The basic expression describing the characteristic impedance $Z_0$ of a single-ended stripline schematically shown in FIG. 5 is:

$$Z_0 = \frac{30}{\sqrt{\varepsilon_r}} \ln\left\{1 + \frac{4}{\pi}\frac{(b-t)}{W'}\left[\frac{8}{\pi}\frac{(b-t)}{W'} + \sqrt{\left(\left(\frac{8}{\pi}\frac{(b-t)}{W'}\right)^2 + 6,27\right)}\right]\right\},$$

where W denotes the width of the signal conductor S, t denotes thickness of the conductor S, b denotes the distance between the ground planes G1 and G2, and $\in_r$ denotes the dielectric constant for the electrically insulating material between the signal conductor S and the ground planes G1 and G2, $$\frac{W'}{b-t} = \frac{W}{b-t} + \frac{\Delta W}{b-t}$$

$$\frac{\Delta W}{b-t} = \frac{x}{\pi(1-x)}\left\{1 - \frac{1}{2}\ln\left[\left(\frac{x}{2-x}\right)^2 + \left(\frac{0,0796x}{W/b+1,1x}\right)^m\right]\right\},$$

$$m = 2\left[1 + \frac{2}{3}\frac{x}{(1-x)}\right]^{-1} \text{ and } x = \frac{t}{b}.$$

Consequently, the characteristic impedance $Z_0$ of a single-ended stripline is scalable as the impedance value is mainly dependent on the ratio W/b, especially if the conductor thickness t is significantly smaller than the distance b between the ground planes G1 and G2 (i.e. t<<b).

Hence, the above expressions describe the underlying relationships for the characteristic impedance in the section MID$_7$ of the proposed ceramic feedthrough interconnection assembly 102. Nevertheless, due to the situations in the sections IN$_9$ and OUT$_8$, the expressions that reflect the actual characteristic impedance are considerably more complex.

The corresponding basic expressions for the characteristic impedance $Z_0$ of a single-ended microstrip, which is schematically illustrated in FIG. 6 are:

$$Z_0 = \frac{\eta_0}{2\pi\sqrt{\varepsilon_\theta}}\ln\left\{\frac{8h}{W'} + 0,25\frac{W'}{h}\right\} \qquad \text{if } \frac{W}{h} \leq 1$$

or $$Z_0 = \frac{\eta_0}{\sqrt{\varepsilon_\theta}} \left\{ \frac{W'}{h} + 1{,}393 + 0{,}667 \ln\left(\frac{W'}{h} + 1{,}444\right) \right\}^{-1} \quad \text{if } \frac{W}{h} > 1$$

where $\eta_0 = 120\pi$, W denotes the width of the signal conductor S, t denotes thickness of the conductor S, b denotes the distance between the conductor S and the ground plane G and $\in_r$ denotes the dielectric constant for the electrically insulating material between the signal conductor S and the ground plane G, $$\frac{W'}{h} = \frac{W}{h} + \frac{1{,}25}{\pi} \frac{t}{h}\left(1 + \ln\left(\frac{4\pi W}{t}\right)\right) \quad \text{if } \frac{W}{h} \leq \frac{1}{2\pi},$$

$$\frac{W'}{h} = \frac{W}{h} + \frac{1{,}25}{\pi} \frac{t}{h}\left(1 + \ln\left(\frac{2h}{t}\right)\right) \quad \text{if } \frac{W}{h} > \frac{1}{2\pi},$$

$$\varepsilon_\theta = \frac{\varepsilon_r + 1}{2} + \frac{\varepsilon_r - 1}{2} F\left(\frac{W}{h}\right) - \frac{(\varepsilon_r - 1)}{4{,}6} \frac{t/h}{\sqrt{W/h}},$$

$$F\left(\frac{W}{h}\right) = \left(1 + 12\frac{h}{W}\right)^{-1/2} + 0{,}04\left(1 - \frac{W}{h}\right)^2 \quad \text{if } \frac{W}{h} \leq 1,$$

$$F\left(\frac{W}{h}\right) = \left(1 + 12\frac{h}{W}\right)^{-1/2} \quad \text{if } \frac{W}{h} > 1,$$

Consequently, also the characteristic impedance $Z_0$ of a single-ended microstrip is scalable as the impedance value is mainly dependent on the ratio W/b, especially if the thickness t of the conductor S is significantly smaller than the distance h between the conductor S and the ground plane G (i.e. t<<h).

Further details pertaining to theoretical expressions for calculating characteristic impedances can be found in Bahl—Bhartia, "Microwave Solid State Circuit Design", John Wiley & Sons 1998, ISBN 0-471-83189-1.

According to the invention, the feedthrough interconnection assembly 102 includes at least two different sections in which the conductors have either a stripline- or a microstrip structure. Naturally, the assembly 102 also contains at least one transition zone between these types of structures. Therefore, the general expressions that describe the characteristic impedance $Z_0$ of the assembly 102 are considerably more complex than the equations above. Hence, a microwave simulator software is preferably used to calculate the specific measures and dimensions of the assembly 102, such that an electrical information signal experiences a well-defined and substantially constant impedance therein.

Specifically, this means that a distance $d_3$ between the electrical leads 103*a*; 103*b* and the lower metal plane 104*b* respective a distance $d_4$ between the electrical leads 103*a*; 103*b* and the upper metal plane 104*a* are optimized with respect to the electrical characteristics of the ceramic 106. The selected distances $d_3$ and $d_4$ respectively result in a distance $d_2$ between the metal planes 104*a* and 104*d*. A total distance $d_1$ between the conducting vias 104*c* and 104*d* is simply selected to a practically suitable value.

As discussed with reference to FIGS. 1 and 2 above, the lower metal plane 104*b* contains an indentation 104*b*' below the outermost part of the electrical leads 103*a*; 103*b* in the assembly 102. The depth of this indentation 104*b*' basically corresponds to length of the section $OUT_8$ in FIG. 2 where the electrical leads 103*a*; 103*b* represent a microstrip structure. The effect of the indentation 104*b*' is that the distance between the electrical leads 103*a*; 103*b* and a closest ground plane becomes different from the distance $d_3$. Instead this distance $d_{12}$ equals a larger value, which is chosen to provide a desired impedance (e.g. 50 Ω) for the electrical information signal in the section $OUT_8$ of the assembly 102 where a non-ceramic material (in most cases the ambient air) adjoins the electrical leads 103*a* and 103*b*.

Figure 4B:
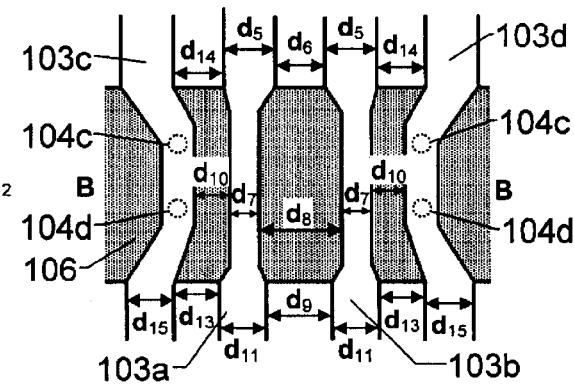

FIG. 4*b* shows a top-view corresponding to the image shown in FIG. 4*a*. The FIG. 4*b* thus illustrates lateral adaptations of the width of the electrical leads 103*a*; 103*b*, the distance between the leads 103*a*; 103*b* and the distance between leads 103*a*; 103*b* and the shield 103*c*; 103*d* in order to compensate for the varying electrical characteristics in the different parts of the assembly 102.

In the innermost section $IN_9$ (see also FIG. 2) the electrical leads 103*a*; 103*b* each have a width $d_5$, The distance between the leads 103*a* and 103*b* is here $d_6$. The dimension $d_5$ and the distance $d_6$ are selected to values being optimal with respect to the electromagnetic conditions in the interface zone between the interior of a capsule including the assembly 102 and the assembly 102 itself.

Correspondingly, in the middle section $MID_7$, the width of the electrical leads 103*a*; 103*b* is $d_7$ (where $d_7 < d_5$) and the distance between the leads 103*a* and 103*b* is $d_8$ (where $d_8 > d_6$). The dimension $d_7$ and the distance is $d_8$ are selected to values being optimal with respect to the electromagnetic conditions in the middle section middle section $MID_7$ of the assembly 102.

Finally, in the outermost section $OUT_8$, the width of the electrical leads 103*a*; 103*b* is $d_{11}$ (where $d_7 < d_5 < d_{11}$) and the distance between the leads 103*a* and 103*b* is $d_9$ (where $d_9 < d_6 < d_8$). The dimension width $d_{11}$ and the distance $d_9$ are selected to values being optimal with respect to the electromagnetic conditions in the interface zone between the exterior of the capsule that includes the assembly 102 and the assembly 102 itself.

In the embodiment of the invention illustrated in FIG. 4*b*, a distance $d_{10}$ between the leads 103*a*; 103*b* and the shield 103*c*; 103*d* is substantially constant throughout the assembly 102. However, if necessary in order to accomplish an optimal impedance match, the distance $d_{10}$ may equally well vary between the different sections $IN_9$, $MID_7$ and $OUT_8$ of the assembly 102, such that it attains a value $d_{14}$ in the section $IN_9$ and a value $d_{13}$ in the section $OUT_8$. The shield leads 103*c* and 103*d* each has a width $d_{15}$ in the section $OUT_8$. If necessary, this width $d_{15}$ may also vary throughout the assembly 102.

According to a preferred embodiment of the invention, the relations between the measures and dimensions $d_1$–$d_{15}$ illustrated in the FIGS. 4*a* and 4*b* are as follows.

Figure 7:
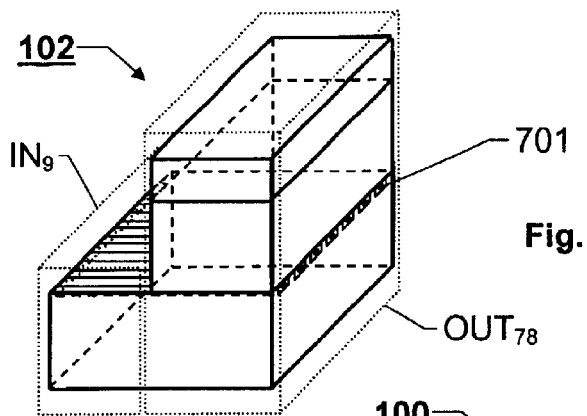
FIG. 7 depicts a cross-section view of an alternative assembly according to an embodiment of the invention.

Provided that $d_3 = X$, then $d_1 = 4 \times$
$d_2 = 2 \times$
$d_4 = X$
$d_5 = 0{,}4 \times$–$0{,}5 \times$
$d_6 = 0{,}4 \times$–$0{,}6 \times$
$d_7 = 0{,}3 \times$
$d_8 = \times$
$d_9 = 0{,}4 \times$–$0{,}6 \times$
$d_{10} = 0{,}4 \times$
$d_{11} = 1{,}2 \times$
$d_{12} = 2 \times$
$d_{13} = 0{,}4 \times$–$0{,}5 \times$
$d_{14} = 0{,}4 \times$–$0{,}6 \times$
$d_{15} = 1{,}2 \times$–$1{,}4 \times$ FIG. 7 shows a cross-section view of feedthrough interconnection assembly 102 according to another embodiment of the invention. The assembly 102 here only includes two different sections $IN_9$ and $OUT_{78}$ respectively. The most important difference between this embodiment and the embodiment described above with reference to the FIGS. 1–4b is that this assembly 102 is adapted to be mounted directly onto a circuit board, i.e. without any bond wires, intermediate conductors or similar. In order to accomplish such a connection between the assembly 102 and the circuit board, each lead has a thickness which allows a solder ball 701 to be placed on the edge surface of the lead, such that the assembly 102 thereby may be soldered onto the circuit board by means of the solder balls. Once the assembly 102 has been mounted in this way the leads in the assembly 102 will not adjoin any electrically insulating material other than what is included in the assembly 102 (which typically is a ceramic material). Therefore, towards the side of the section $OUT_{78}$ which is intended to face the circuit board, the dimensions of the shield and the distance between the shield and the at least one signal lead need only be adapted with respect to the dielectric constant of this electrically insulating material.

However, in the second section $IN_9$ and in a transition region between the first section $OUT_{78}$ and the second section $IN_9$, adaptations corresponding to those described above with reference to the FIGS. 1–4b need to be made in order to render an impedance experienced by the electrical information signal well-defined and substantially constant.

Conventionally, the optoelectrical units (such as lasers and photodetectors) in optoelectrical transceivers have been oriented with their largest side in parallel with the circuit board on which they are mounted. A largest possible interface area has thereby been accomplished towards at least one heat sink being placed either below, above or both below and above the circuit board. This design, however, results in a relatively large footprint for each optoelectrical unit, which in turn consumes valuable circuit board area that could have been used by other units. Therefore, the present invention proposes that the optoelectrical units instead be placed such that they show a face with considerably smaller area towards the circuit board.

Figure 8:
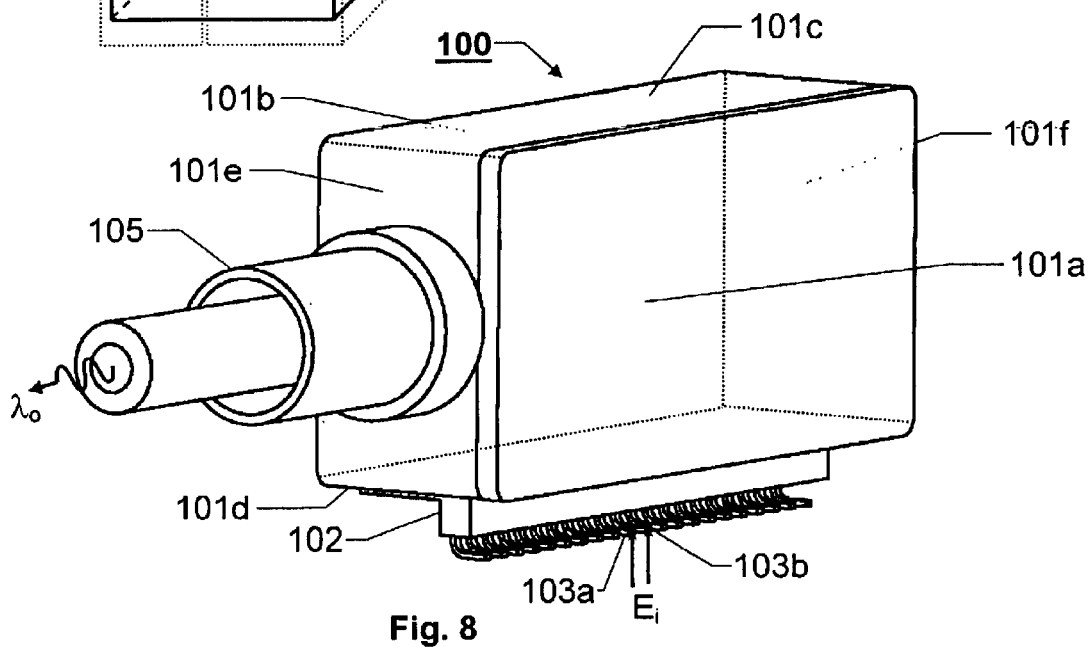
FIG. 8 shows a capsule containing a laser unit according to an embodiment of the invention.

FIG. 8 illustrates a first example of this strategy, where a capsule 100 containing a laser unit is intended to stand on one of its relatively small area sides 101d. The laser capsule 100 is here presumed to have the general shape of a rectangular parallelepiped with two relatively large area sides 101a; 101b and four relatively small area sides 101c, 101d, 101e and 101f. The latter may either all have substantially the same size, or as illustrated in FIG. 8, include two somewhat larger sides 101c; 101d and two somewhat smaller sides 101e; 101f. Although the exact relationship between the relatively large area sides 101a; 101b and the relatively small area sides 101c–f is not critical for the proposed solution, the relatively large area sides 101a; 101b should preferably have at least 50% larger area than the largest of the relatively small area sides 101c–f. It is furthermore advantageous, from an assembly point of view, if the capsule 100 is adapted to be mounted such that the relatively large area sides 101a; 101b are oriented substantially perpendicular to the circuit board. An assembly 102 as described with reference to FIGS. 1–4b above in the base side 101d of the capsule 100 contains two electrical leads 103a and 103b via which an incoming electrical signal $E_1$ is received to the laser unit.

Naturally, the capsule may equally well have any alternative shape different from that of a rectangular parallelepiped. For instance, one or more of the capsule's sides may be more or less tilted with respect to each other, such that they are either all pair wise parallel to each other or at least two opposite sides are non-parallel to each other. Hence, the capsule may describe a tilted parallelepiped or a truncated pyramid. Moreover, as likewise can be seen in FIG. 8, one or more of the capsule's 100 edges and/or corners may be rounded. Anyhow, the capsule is adapted to be positioned on a circuit board, such that its footprint towards the circuit board has a smaller area than the area of the capsule's largest side. In case the capsule has the general shape of a rectangular parallelepiped, the footprint towards the circuit board becomes minimal if the capsule's relatively large area sides are oriented substantially perpendicular to a component side of the circuit board and the capsule stands on one of its smallest sides.

The laser unit inside the capsule 100 produces an outgoing optical signal $\lambda_o$ in response to the electrical signal $E_1$ that represents the same information as the electrical signal $E_1$. The optical signal $\lambda_o$ is fed out from the capsule 100 to an optical fiber (not shown) via an optical connector 105, for example of LC-type (Lucent), SC-type (subscriber connector) or MU-type (NTT). Here, the optical connector 105 is attached to one of the relatively small area sides 101e. Technically however, it may equally well be attached to one of the relatively large area sides 101a or 101b.

Figure 9:
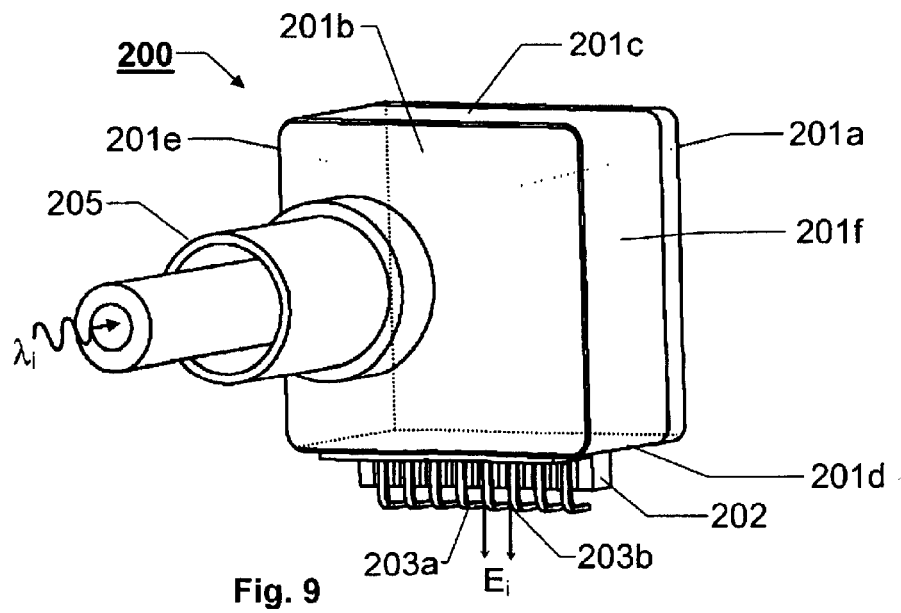
FIG. 9 shows a capsule containing a photodetection unit according to an embodiment of the invention.

FIG. 9 shows second example of a capsule 200 that contains an optoelectrical unit according to an embodiment of the present invention. In analogy with the capsule 100 shown in FIG. 1, the photodetection capsule 200 is presumed to have the general shape of a rectangular parallelepiped with two relatively large area sides 201a; 201b and four relatively small area sides 201c, 201d, 201e and 201f. The photodetection capsule 200 is intended to stand on one of its relatively small area sides 201d on a circuit board. As is apparent from FIG. 9, the relatively small area sides 201c–f all have approximately the same size. However, the relatively small area sides 201c–f may equally well have sizes, which are substantially different in pairs, i.e. represent two somewhat larger sides and two somewhat smaller sides. Although again, neither the exact relationship between the relatively large area sides 201a; 201b and the relatively small area sides 201c–f nor the geometrical shape of the capsule is critical for the proposed solution. In any case, the capsule 200 should be adapted to be mounted such that its footprint towards the circuit board is smaller then the area of a largest side of the capsule.

According to a preferred embodiment of the invention, the capsule 200 receives an incoming optical signal $\lambda_1$ from, for example, an optical fiber (not shown) via an optical connector 205 on one of the capsule's 200 relatively large area sides 201b. The optical connector 205 may for instance be of LC-type (Lucent), SC-type (subscriber connector) or MU-type (NTT) The photodetection unit within the capsule 200 converts the optical signal $\lambda_o$ into a corresponding electrical signal $E_o$ that represents the same information as the optical signal $\lambda_o$. A ceramic feedthrough 202 in a base side 201d of the capsule 200 contains two electrical leads 203a and 203b via which the electrical signal $E_o$ is delivered to other circuit elements for further processing.

Figure 10:
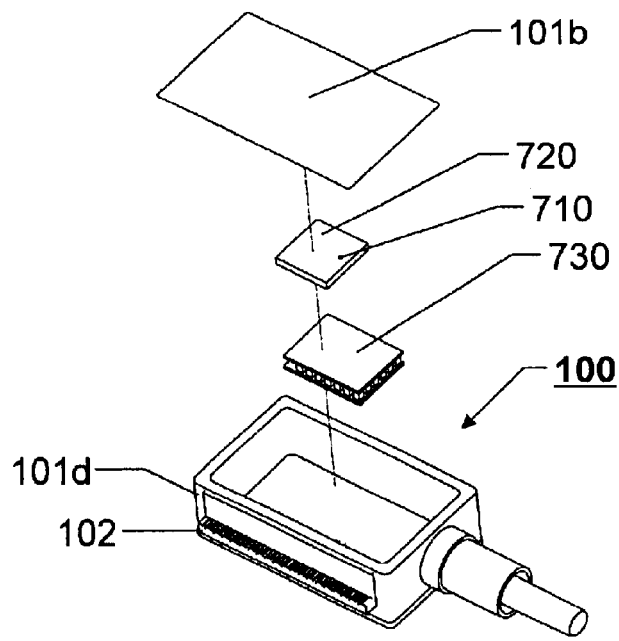
FIG. 10 shows an exploded diagram over a laser capsule according to an embodiment of the invention.

FIG. 10 shows an exploded diagram over a laser capsule 100 according to an embodiment of the invention. Here, an optoelectrical component in the form of a laser unit 710 is arranged on a silicon carrier 720. The carrier 720 is in turn mounted on a cooling element 730 being positioned on the inside of a side 101a of the capsule 100. A set of signal leads are fed to the laser unit 710 and the control circuitry in the silicon carrier 720 via a feedthrough interconnection assembly 102 in a base side 101d of the capsule 100. A capsule side 101b in the form of a lid is used to seal the capsule 100 after assembly of the units therein.

Figure 11:
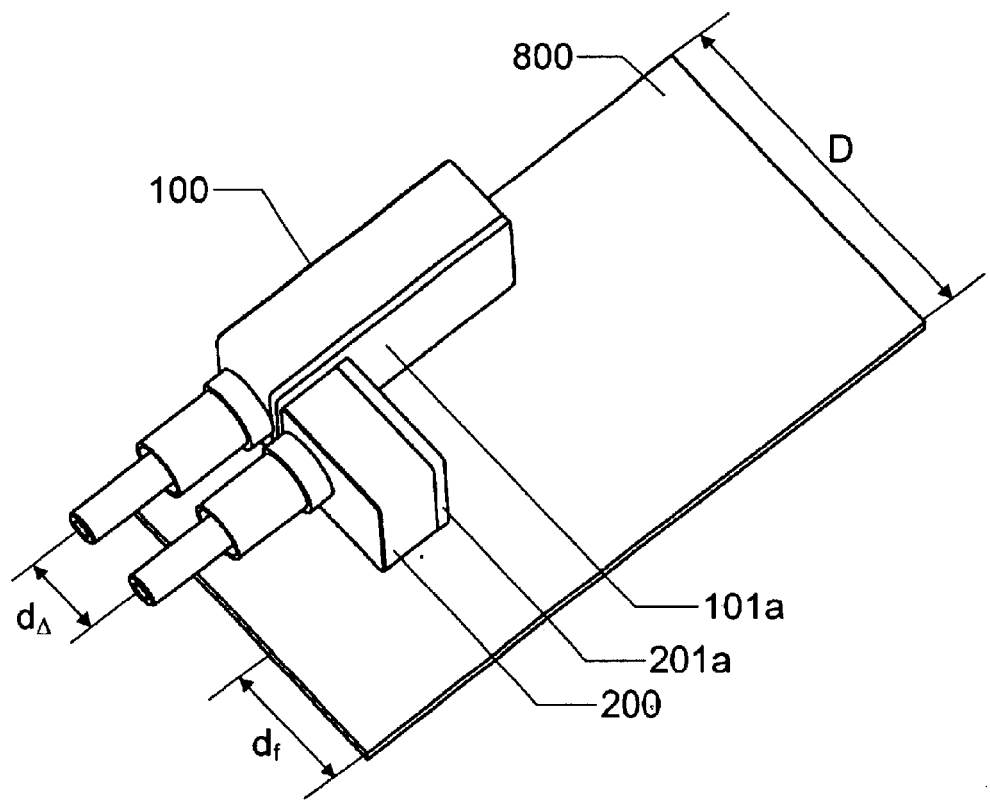
FIG. 11 depicts a circuit board according to an embodiment of the invention onto which the capsules shown in FIGS. 8–10 are mounted.

FIG. 11 depicts a circuit board 800 according to an embodiment of the invention, which comprises a laser capsule 100 and a photodetection capsule 200 as described above with reference to FIGS. 8–10. Both the capsules 100 and 200 are here positioned on the circuit board 800, such that their relatively large area sides 101a, 101b and 201a, 201b respectively are oriented substantially perpendicular to a component side of the circuit board 800. Of course, this results in a relatively small total footprint. For a given width D of the circuit board 800, a relatively large front space $d_f$ also becomes available for other purposes than connecting optical fibers, for example displays (not shown) to indicate a transceiver status. Moreover, the distance $d_A$ between the optical connectors 105 and 205 can thereby be made comparatively short.

Although not absolutely necessary, it is preferable if the capsules 100 and 200 each comprises a multitude of distinct capsule sides. Naturally, in case the capsule has the general shape of a rectangular parallelepiped, the number of such sides is six. For reasons of interference reduction and in order to facilitate the assemblage of the capsule, it is also preferable if exclusively one side (101d in FIG. 8 and 201d in FIG. 9 respectively) contains the ceramic interconnection feedthrough assembly (102 in FIG. 8 and 202 in FIG. 9 respectively). This design is namely expected to minimize the lead distance between the capsules 100; 200 and the circuit board 800 when the capsules 100; 200 are positioned as intended on the circuit board 800.

For the same reasons, it also preferable if the side 101d, which contains the assembly 102 is adapted to be oriented substantially parallel with and relatively proximate to the circuit board 800 when the capsule 100 is positioned on the circuit board 800. Technically however, it is feasible to instead arrange the assembly 102 in the lowermost portion of one of the sides 101a or 101b, which are intended to be positioned substantially perpendicular to the circuit board 800.

The term "comprises/comprising" when used in this specification is taken to specify the presence of stated features, integers, steps or components. However, the term does not preclude the presence or addition of one or more additional features, integers, steps or components or groups thereof.

The invention is not restricted to the described embodiments in the figures, but may be varied freely within the scope of the claims.

What is claimed is:

1. A ceramic feedthrough interconnection assembly comprising:
   A. a matrix having
      a. a first section comprising an electrically insulating material having a first dielectric constant; and
      b. a second section comprising an electrically insulating material having a second dielectric constant;
   B. said matrix further comprising:
      a. a first trans-matrix signal lead for communicating an electrical information signal such that said signal lead is exposed exclusively to said first electrically insulating material in said first section and to said second electrically insulating material in said second section; and
      b. a trans-matrix auxiliary lead; and
   C. a shield extending through said first and second sections and electrically shielding said signal lead from said auxiliary lead, said shield in said first and second sections is positioned at a distance from said signal lead with respect to the dielectric constant of any electrically insulating material such that the electrical information signal experiences a defined and substantially constant impedance.

2. The ceramic feedthrough interconnection assembly of claim 1 further comprising a second trans-matrix signal lead for communicating the electrical information signal on a differential signal format, said first and second signal leads being separated by a distance of electrically insulating material in each of said first and second sections, said distance being adapted with respect to the dielectric constant of the material present between said first and second signal leads.

3. The ceramic feedthrough interconnection assembly of claim 2 further comprising a design adapted to extend over a single face of a component capsule.

4. The ceramic feedthrough interconnection assembly of claim 2 in which said first signal lead comprises a stripline structure in said first section.

5. The ceramic feedthrough interconnection assembly of claim 4 in which said first signal lead comprises a microstrip structure in said second section.

6. The ceramic feedthrough interconnection assembly of claim 1 in which said shield comprises a lead for connection to an external ground potential.

7. The ceramic feedthrough interconnection assembly according to claim 6 in which said shield exclusively surrounds said first signal lead.

8. The ceramic feedthrough interconnection assembly according to claim 1 in which said electrically insulating material in said first section comprises a ceramic material, and said electrically insulating material in said second section comprises a non-ceramic electrically insulating material.

9. The ceramic feedthrough interconnection assembly of claim 8 in which said first signal lead comprises a stripline structure in said first section.

10. The ceramic feedthrough interconnection assembly of claim 8 further comprising a second trans-matrix signal lead.

11. A ceramic feedthrough interconnection assembly comprising:
    A. a matrix having
       a. a first section comprising a ceramic electrically insulating material having a first dielectric constant; and
       b. a second section comprising a non-ceramic electrically insulating material having a second dielectric constant;
    B. said matrix further comprising:
       a. at least two trans-matrix signal leads for communicating an electrical information signal such that said signal leads are exposed exclusively to said first electrically insulating material in said first section and to said second electrically insulating material in said second section; and
       b. a trans-matrix auxiliary lead; and
    C. a shield extending through said first and second sections and electrically shielding said signal leads from said auxiliary lead, said shield in said first and second sections is of a size and shape so as to provide a defined and substantially constant impedance in said signal leads.

12. The ceramic feedthrough interconnection assembly of claim 11 further comprising a design adapted to extend over a single face of a component capsule.

13. The ceramic feedthrough interconnection assembly of claim 11 in which said first signal lead comprises a stripline structure in said first section.

14. The ceramic feedthrough interconnection assembly of claim 13 in which said shield comprises a lead for connection to an external ground potential.

15. The ceramic feedthrough interconnection assembly of claim 13 in which said first signal lead comprises a microstrip structure in said second section.

16. An optoelectrical capsule for converting information signals between an electrical signal format and an optical signal format, comprising a capsule having a feedthrough interconnection assembly comprising:

A. a matrix having
   a. a first section comprising an electrically insulating material having a first dielectric constant; and
   b. a second section comprising an electrically insulating material having a second dielectric constant;

B. said matrix further comprising:
   a. a trans-matrix signal lead for communicating an electrical information signal such that said signal lead is exposed exclusively to said first electrically insulating material in said first section and to said second electrically insulating material in said second section; and
   b. a trans-matrix auxiliary lead; and C. a shield extending through said first and second sections and electrically shielding said signal lead from said auxiliary lead, said shield in said first and second sections is positioned at a distance from said signal lead with respect to the dielectric constant of any electrically insulating material such that the electrical information signal experiences, and is of a size and shape so as to provide, a defined and substantially constant impedance.

17. The optoelectrical capsule of claim 16 in which said electrically insulating material having a first dielectric constant comprising a ceramic material.

18. The optoelectrical capsule of claim 16 in which said electrically insulating material having a second dielectric constant comprising a non-ceramic material.

19. The optoelectrical capsule of claim 16 further comprising positioning said feedthrough interconnection assembly in a manner effective to permit said capsule to a circuit board footprint smaller than the largest side of said capsule.

20. An optoelectrical transceiver unit comprising a circuit board comprising the optoelectrical capsule according to claim 19.

* * * * *